United States Patent [19]
Umotoy et al.

[11] Patent Number: 6,079,356
[45] Date of Patent: *Jun. 27, 2000

[54] REACTOR OPTIMIZED FOR CHEMICAL VAPOR DEPOSITION OF TITANIUM

[75] Inventors: Salvador Umotoy, Antioch; Anh N. Nguyen, Milpitas; Truc T. Tran, Fremont; Lawrence Chung-Lei, Milpitas; Mei Chang, Saratoga, all of Calif.

[73] Assignee: Applied Materials, Inc., Santa Clara, Calif.

[ * ] Notice: This patent is subject to a terminal disclaimer.

[21] Appl. No.: 09/023,866

[22] Filed: Feb. 13, 1998

Related U.S. Application Data

[63] Continuation-in-part of application No. 08/982,944, Dec. 2, 1997, abandoned.

[51] Int. Cl.$^7$ .................................................. C23C 16/00
[52] U.S. Cl. ........................................ 118/723 E; 118/728
[58] Field of Search ................................... 118/715, 725, 118/723 E, 728, 500, 724

[56] References Cited

U.S. PATENT DOCUMENTS

| | | | |
|---|---|---|---|
| 4,960,488 | 10/1990 | Law et al. | 156/643 |
| 5,628,829 | 5/1997 | Foster et al. | 118/723 |
| 5,665,640 | 9/1997 | Foster et al. | 438/680 |
| 5,755,886 | 5/1998 | Wang et al. | 118/715 |
| 5,882,411 | 3/1999 | Zhao et al. | 118/715 |
| 5,906,683 | 5/1999 | Chen et al. | 118/724 |

OTHER PUBLICATIONS

Doppelt et al., Chemical Vapor Deposition of Copper for IC Metallization: Precursor Chemistry and Molecular Structure, MRS Bulletin, vol. 19, No. 8, Aug. 1994, pp. 41–48.

Gelatos et al., Chemical Vapor Deposition of Copper for Advanced On–Chip Interconnects, MRS Bulletin, vol. 19, No. 8, Aug. 1994, pp. 49–54.

*Primary Examiner*—Shrive Beck
*Assistant Examiner*—Parviz Hassanzadeh
*Attorney, Agent, or Firm*—Law Office of Charles Guenzer

[57] ABSTRACT

A plasma reaction chamber particularly suited for plasma-enhance chemical vapor deposition of titanium using $TiCl_4$ as the precursor. The reactor includes a perforated showerhead faceplate and a perforated blocker plate within the showerhead to evenly distribute the atomized $TiCl_4$. Both the showerhead faceplate and the blocker plate are made of solid nickel. RF power is applied between the showerhead faceplate and the heater pedestal supporting the wafer to excite the processing gas into a plasma. A shield ring is set on the periphery of the heater pedestal to confine the plasma to the processing region above the wafer. The shield ring is supported on the heater pedestal by a downwardly descending ridge, thereby minimizing thermal flow. The shield ring also protects the periphery of the top surface of the heater pedestal not covered by the wafer. An isolator electrically insulates the RF-driven showerhead from the chamber body and is disposed generally above the shield ring. The bottom of the isolator and the top of the shield ring are similarly curved with a nearly constant gap between them. The small gap creates a flow choke between the processing region and an annular pumping channel. The curve of the gap prevents the plasma from extending into the pumping channel. The bottom of the chamber below the heater pedestal is covered with a quartz thermal shield insert to reduce the flow of heat to the chamber wall. A lift ring for raising lift pins selectively lifting the wafer is also composed of quartz.

23 Claims, 13 Drawing Sheets

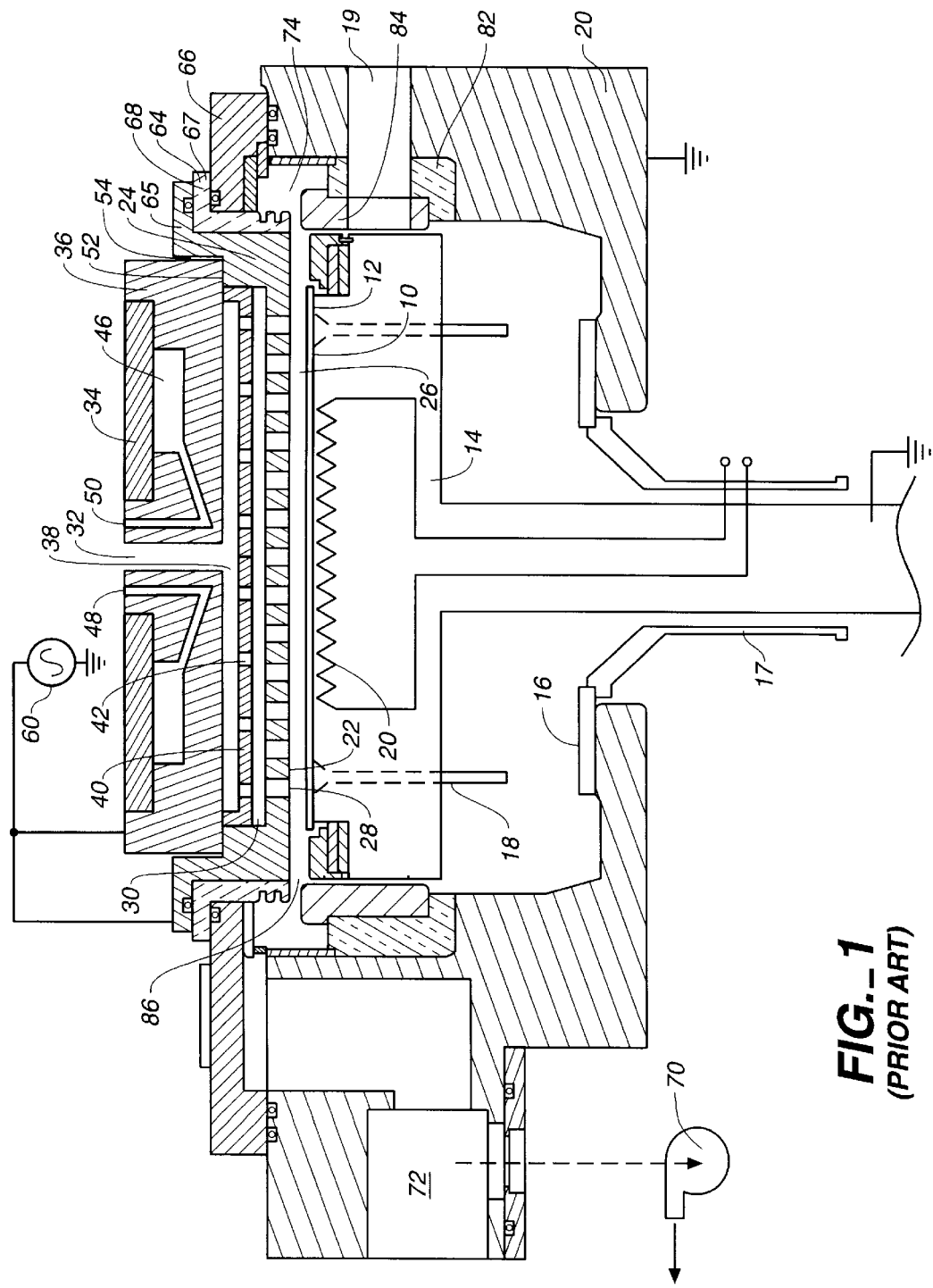
FIG._1
(PRIOR ART)

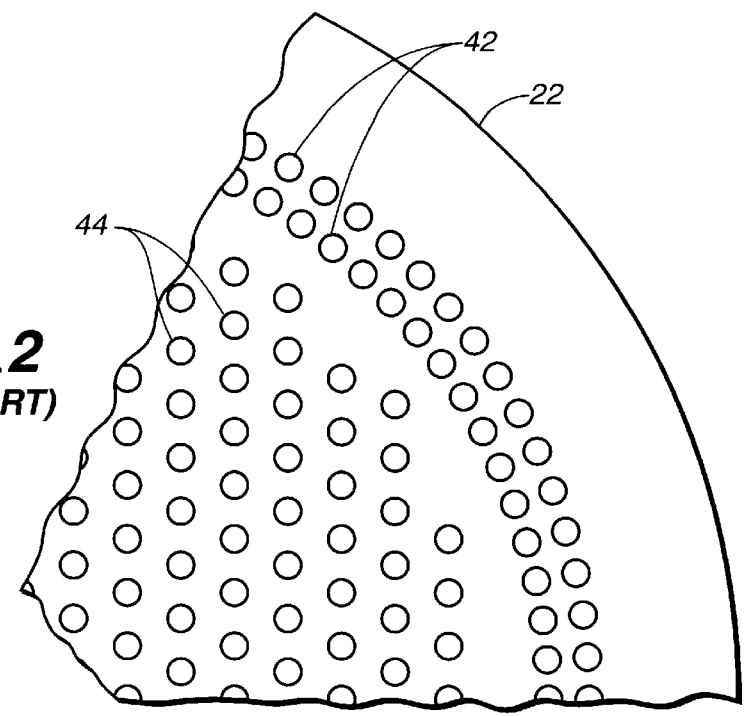
FIG._2
(PRIOR ART)
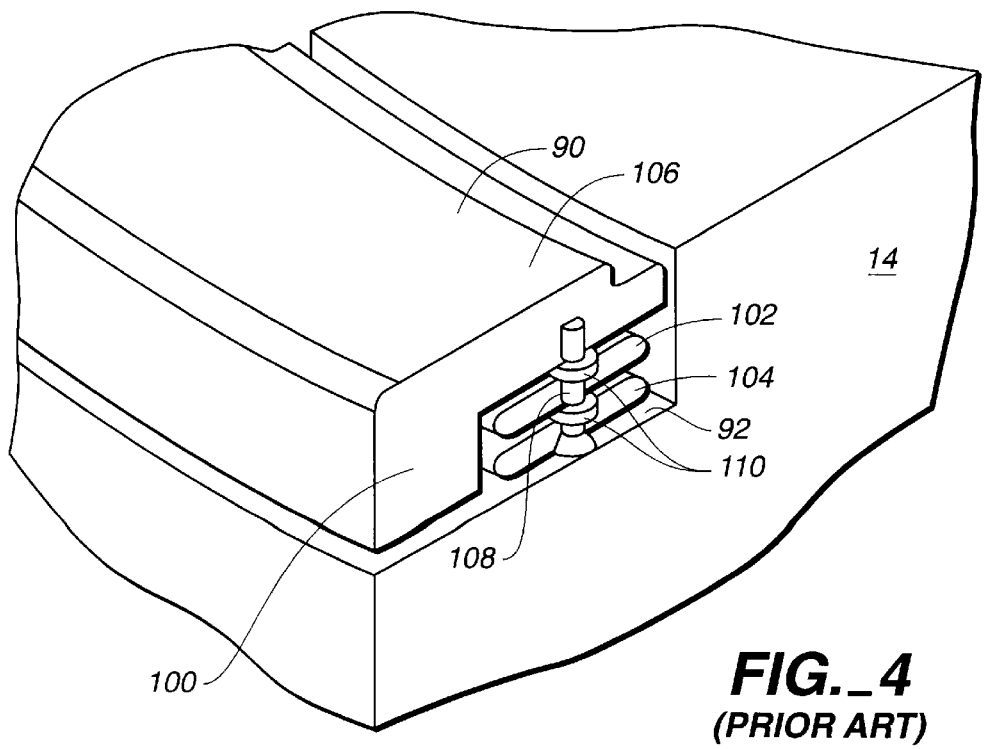
FIG._4
(PRIOR ART)

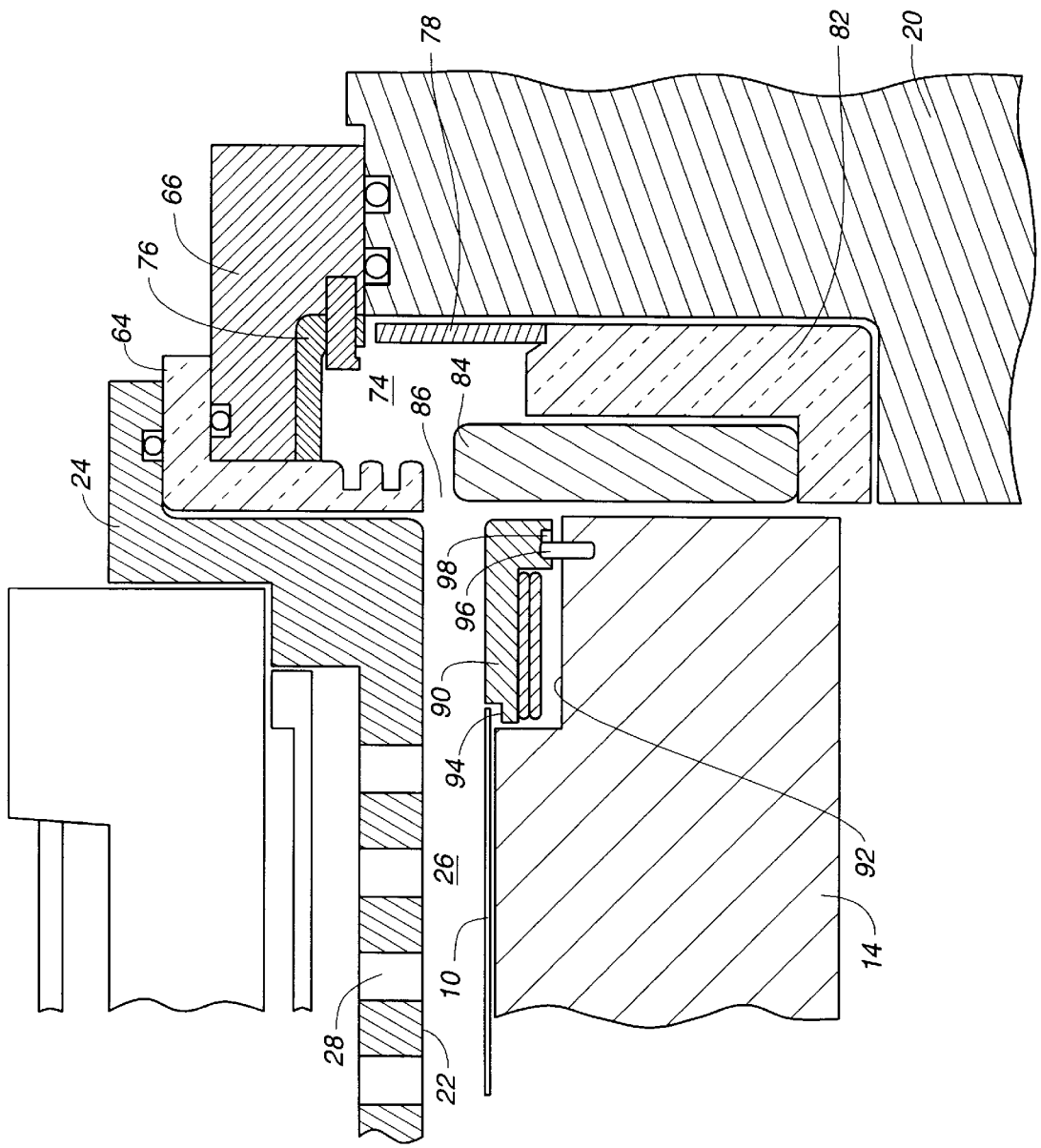
FIG._3 (PRIOR ART)

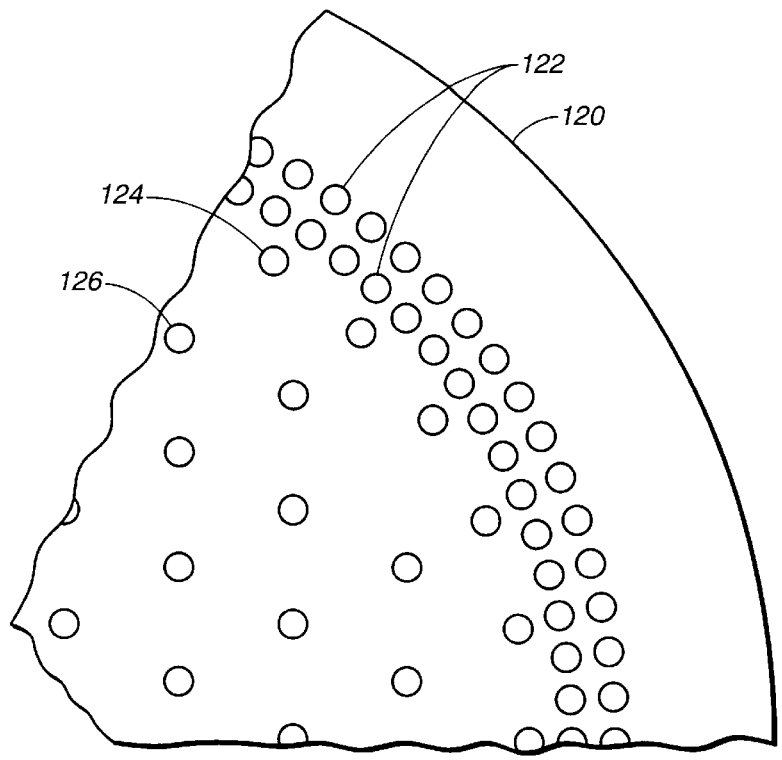
FIG._5
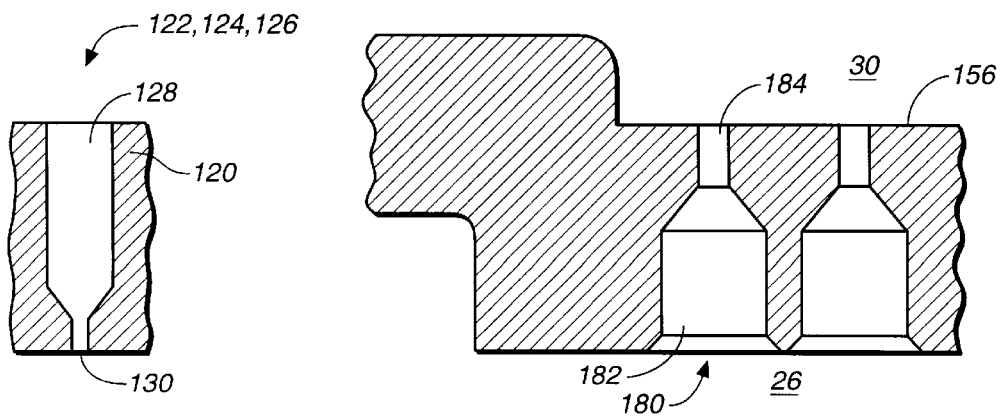
FIG._6  FIG._11

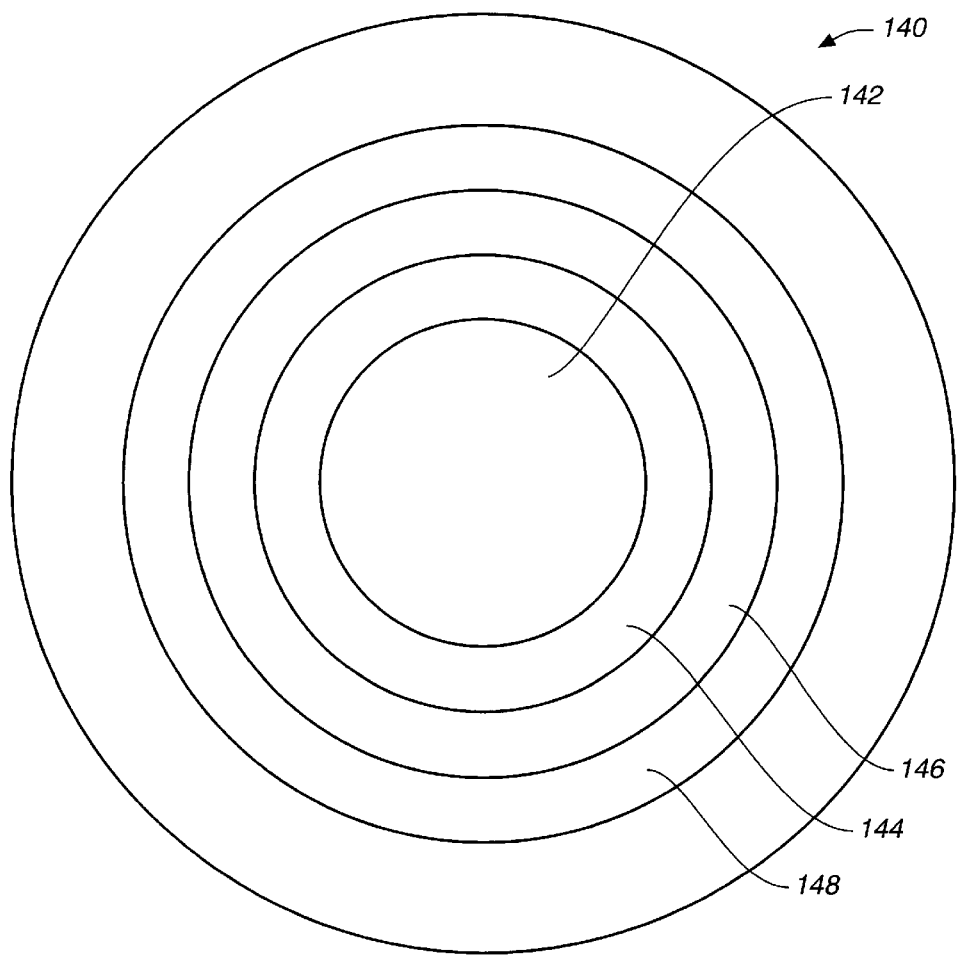
FIG._7

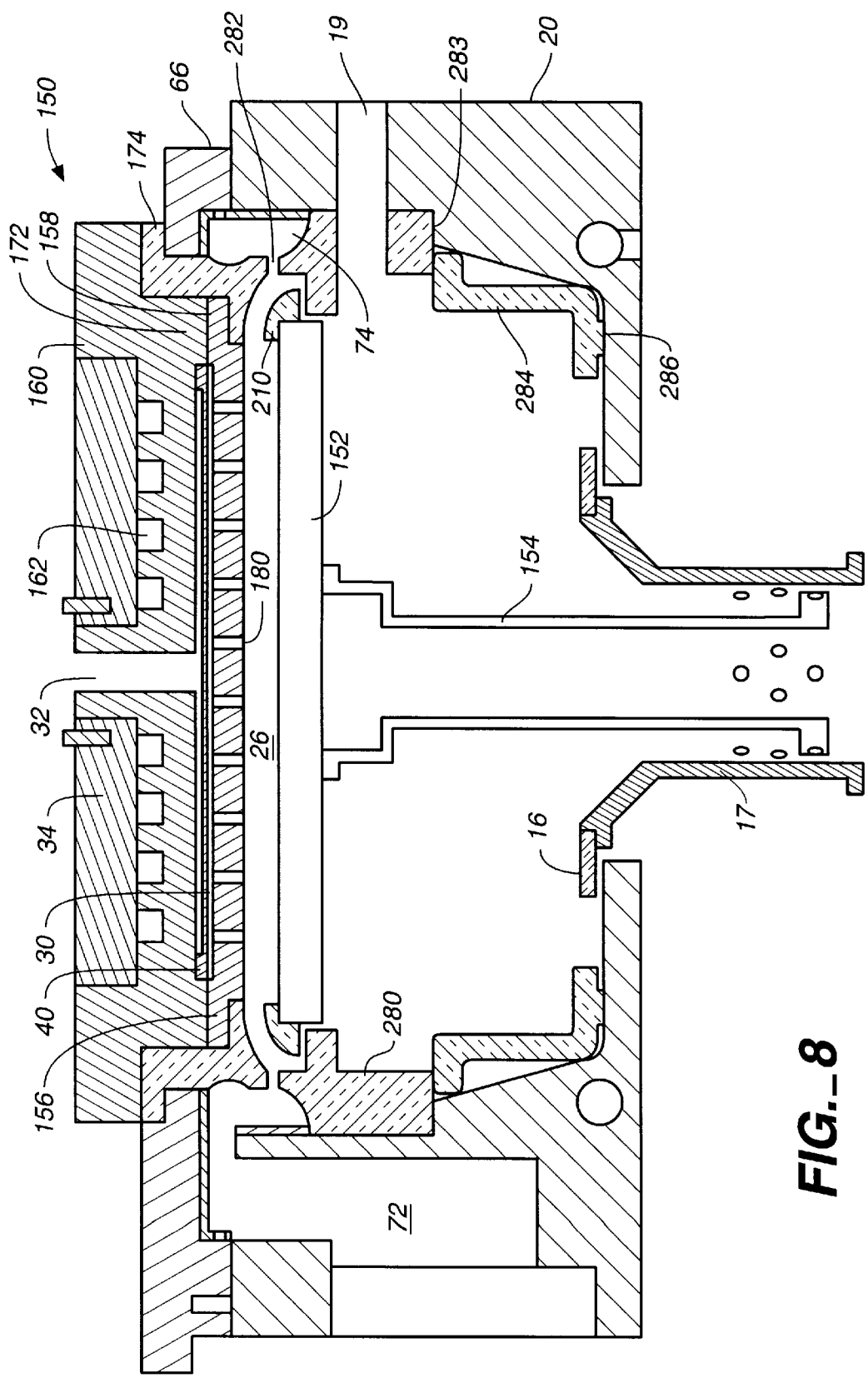

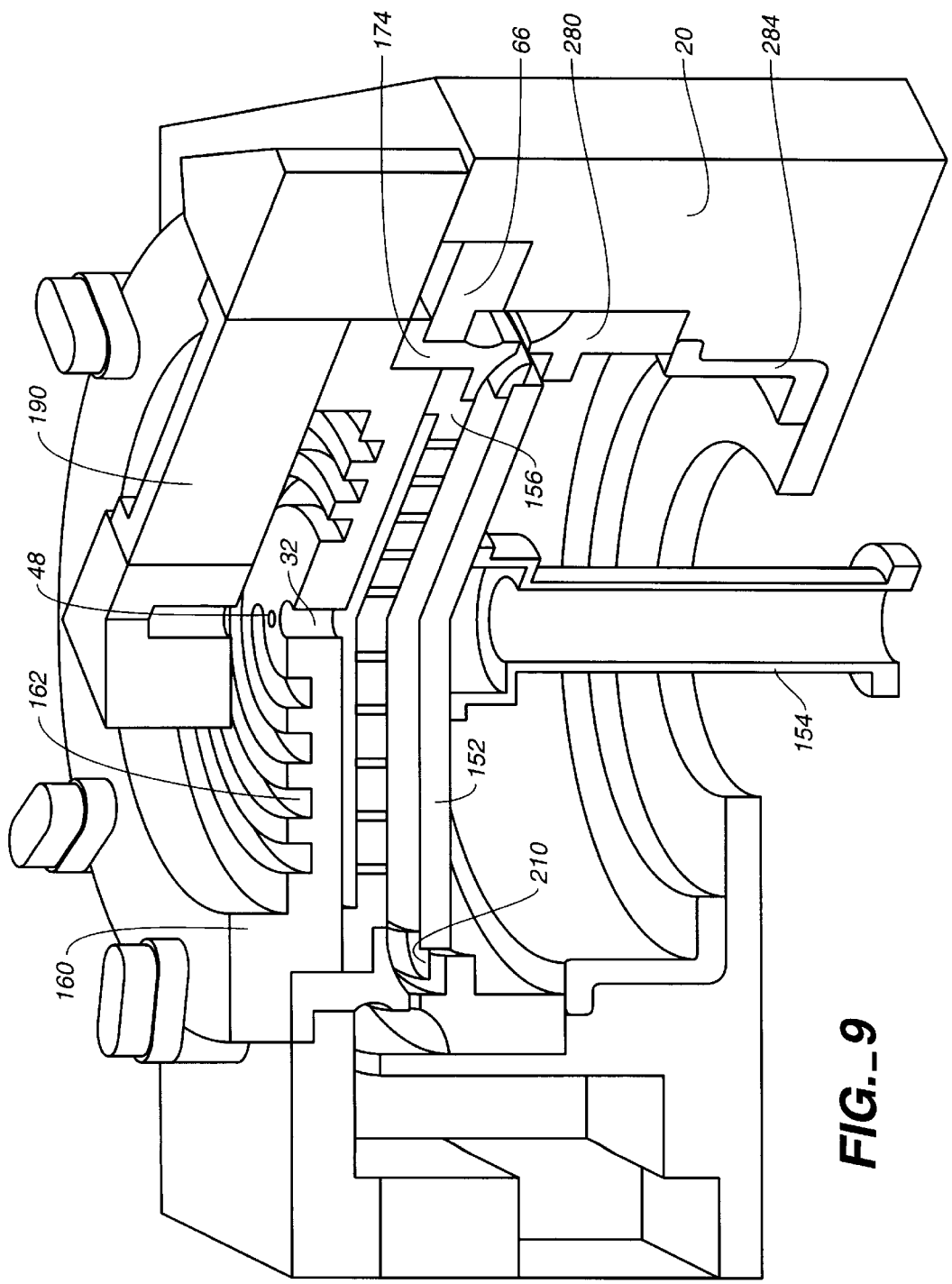
FIG._9

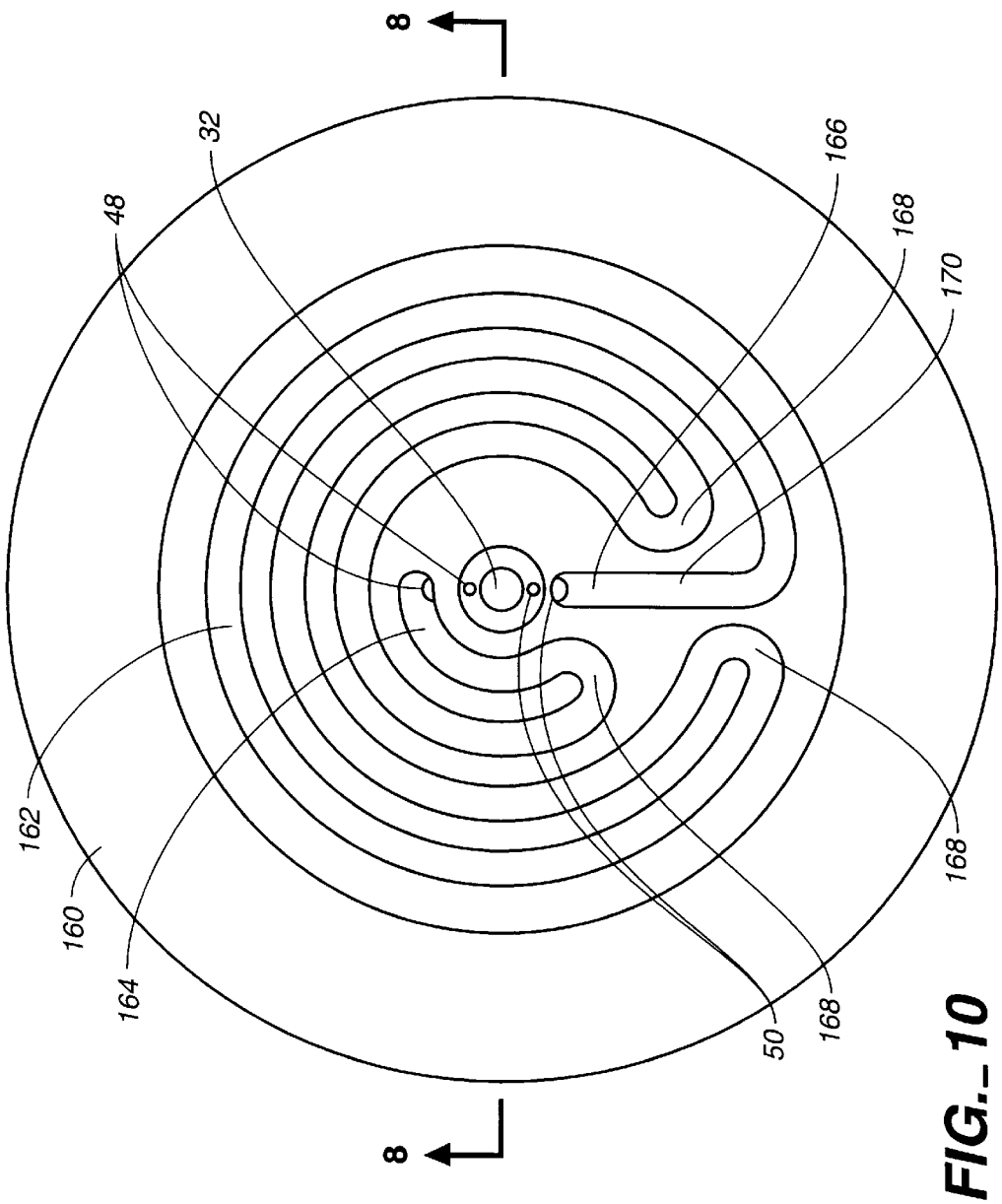
FIG._10

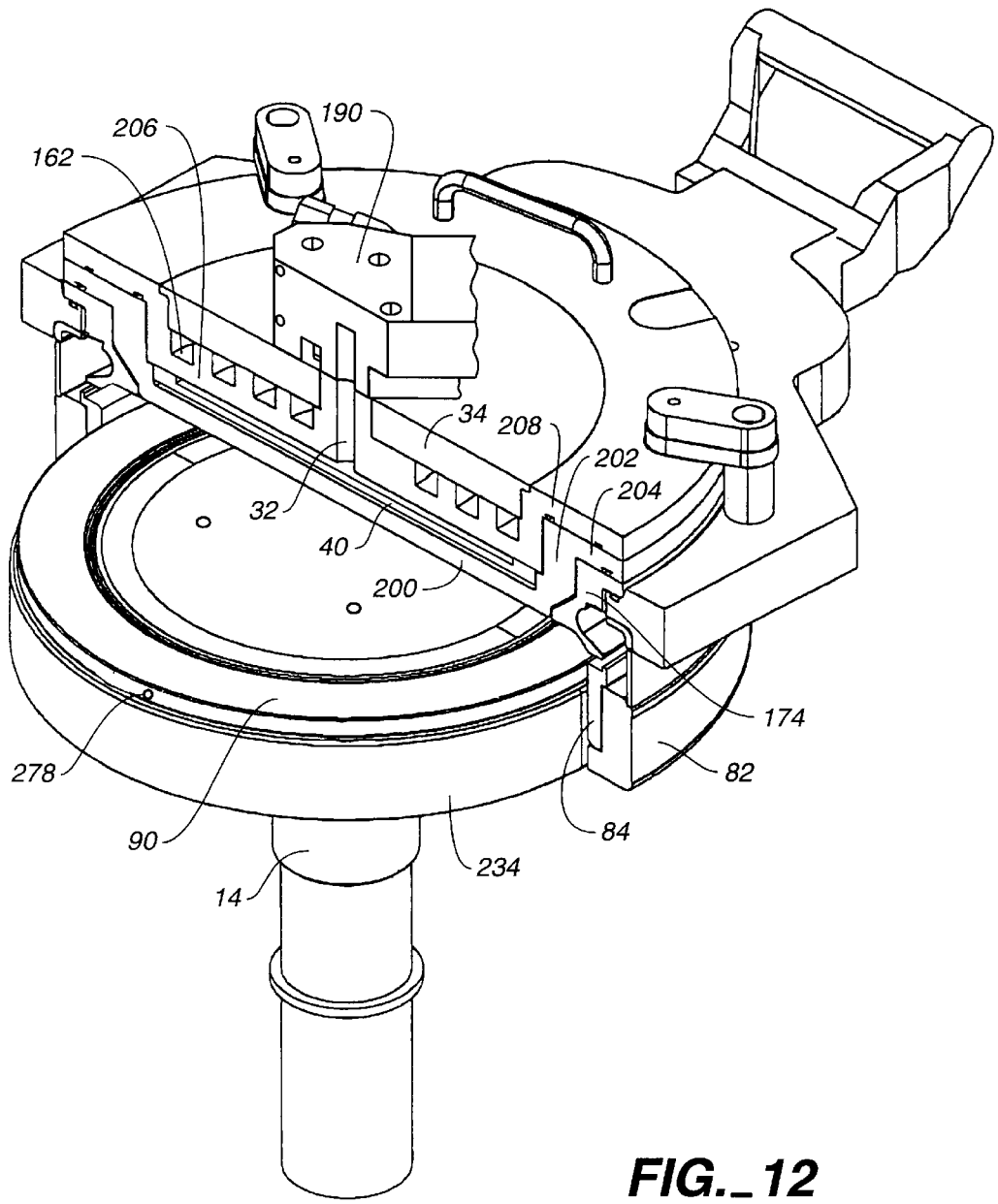
FIG._12

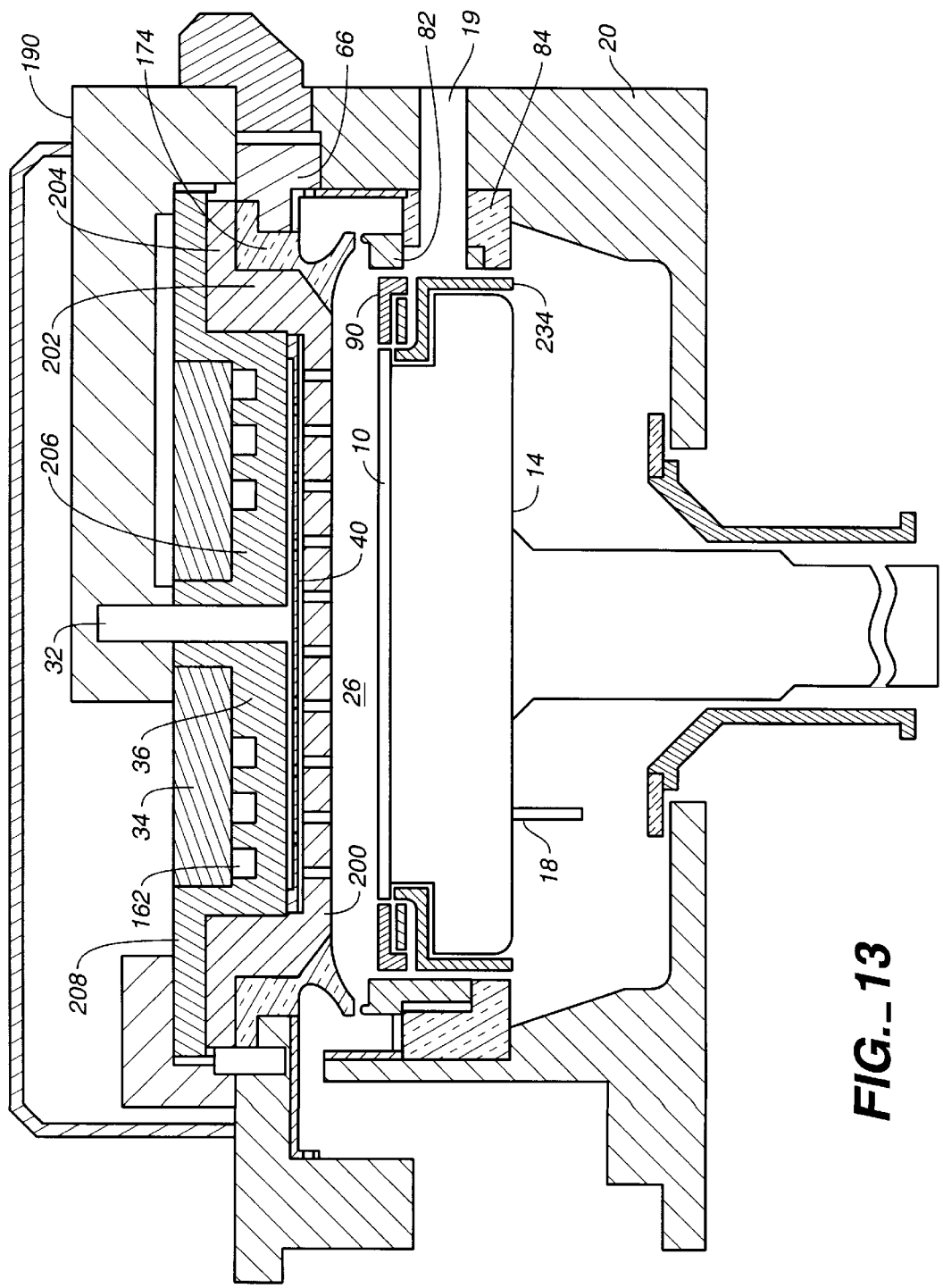
FIG._13

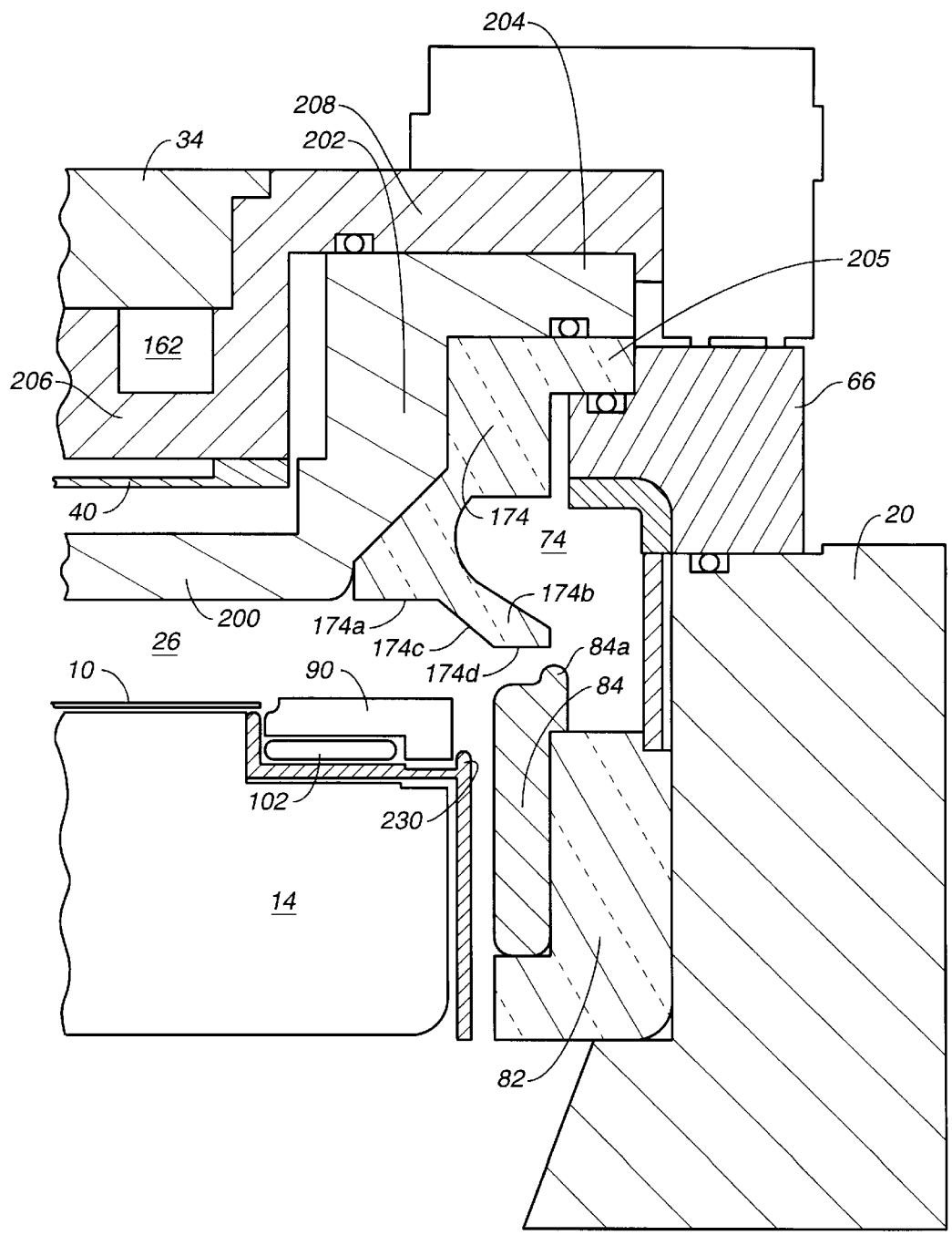
FIG._14

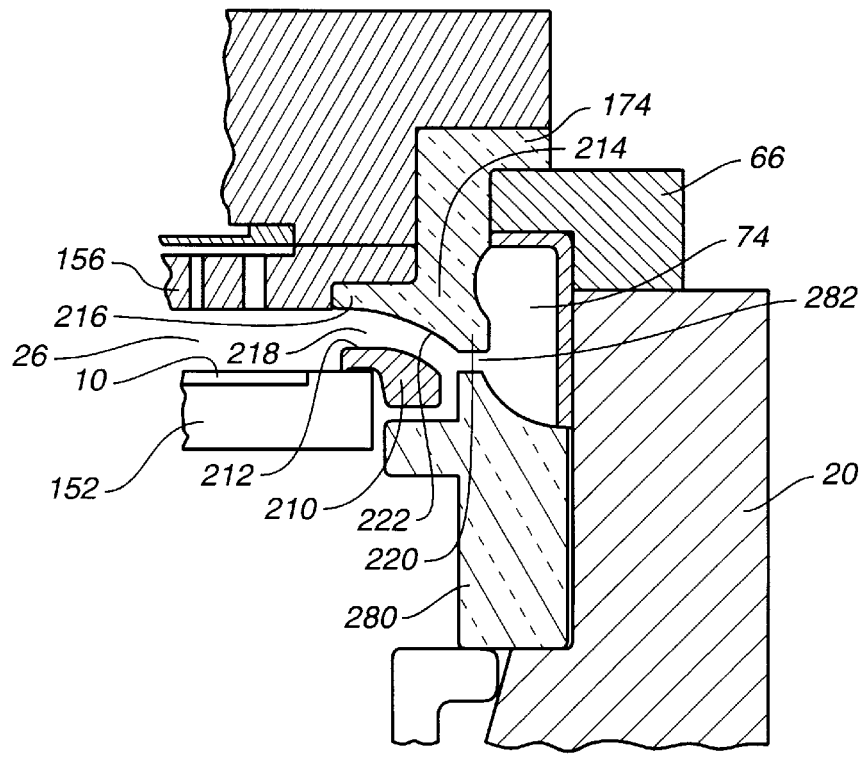
FIG._15
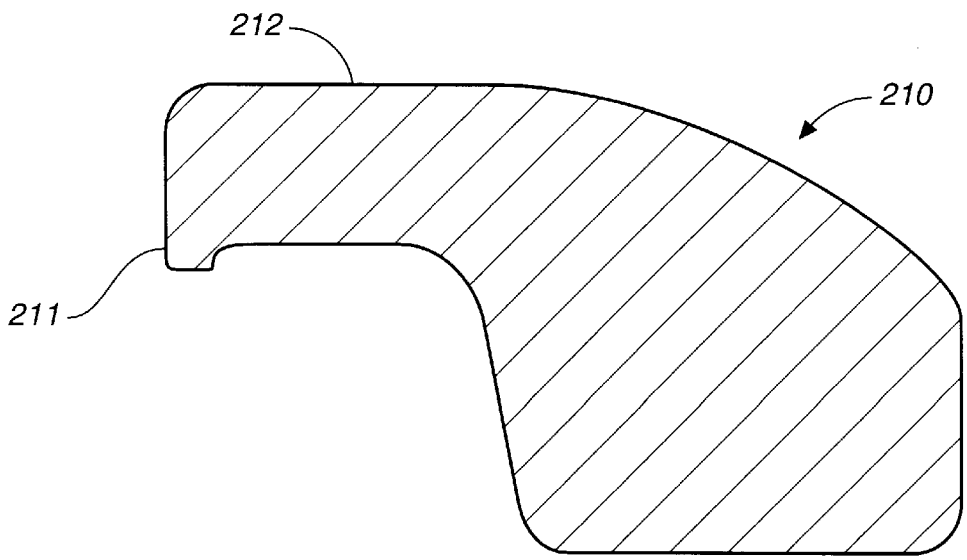
FIG._16

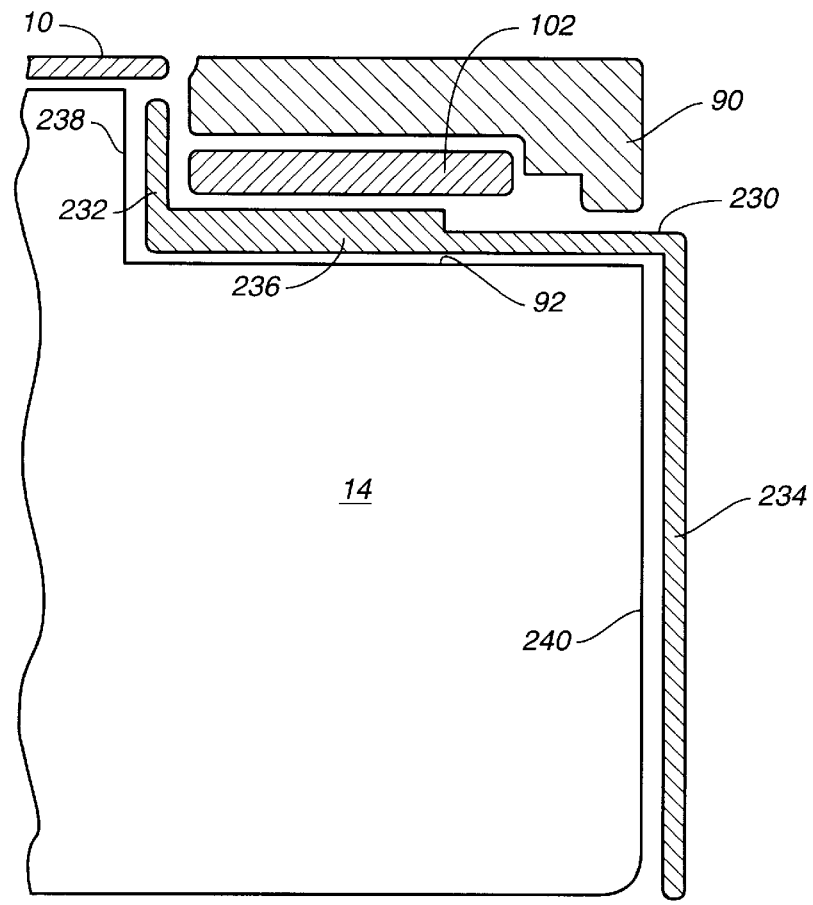
FIG._17
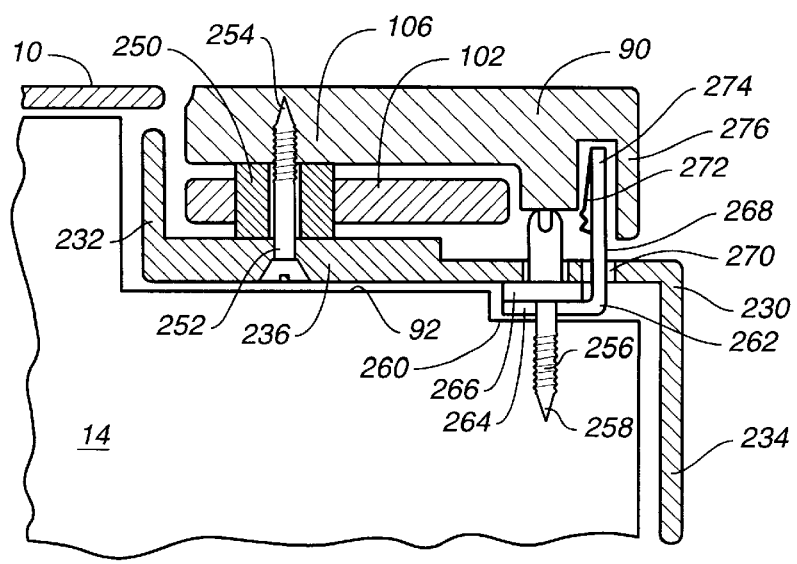
FIG._18

6,079,356

REACTOR OPTIMIZED FOR CHEMICAL VAPOR DEPOSITION OF TITANIUM

RELATED APPLICATION

This application is a continuation in part of Ser. No. 08/982,944, filed Dec. 2, 1997, now abandoned. This application is also related to application Ser. No. 08/982,727, filed Dec. 2, 1997, and to concurrently filed applications Ser. Nos. 09/023,437 and 09/023,852 concurrently filed on Feb. 13, 1998.

FIELD OF THE INVENTION

The invention relates generally to plasma reactors and their operation. In particular, the invention relates to the reactors capable of plasma-enhanced chemical vapor deposition.

BACKGROUND ART

Plasma-enhanced chemical vapor deposition (PECVD) is an important and widely practice method of depositing films in advanced semiconductor integrated circuits. In PECVD, a precursor gas is admitted into a reaction chamber held at a reduced pressure, and oscillatory electric energy at a radio frequency (RF) is applied to the chamber to excite the gas into a plasma. The gas reacts with the surface of a wafer exposed to the plasma to form a film on the wafer of a composition derived from that of the precursor gas.

Probably the widest use of PECVD for silicon integrated circuits involves the deposition of silicon dioxide ($SiO_2$), also referred to as silica or simply oxide. The oxide forms an insulating layer, for example, between layers of electrical interconnects. The favored precursor for silicon dioxide formed by PECVD is tetraethyl orthosilicate (TEOS). PECVD is the favored technique for depositing oxide because the plasma supplies the activation energy rather than in a thermally activated process in which high temperature provides the energy. Therefore, the oxide can be deposited at relatively low temperatures over previously defined features, thereby reducing the thermal budget used for the oxide.

Sputtering (also called physical vapor deposition or PVD) has enjoyed the widest use in the deposition of layers of metals and other conductive materials because of its high deposition rate and low cost of precursor materials. However, sputtering is a generally ballistic process and has difficulty in coating narrow and deep apertures, of the sort required for via and contact holes between wiring layers. One favored technique for filling such holes is to first conformally coat the walls of the hole with a thin layer of titanium (Ti) and then to conformally coat the Ti-covered walls with a thin layer of titanium nitride (TiN). Thereafter, sputtered aluminum more easily filled into the hole. The Ti/TiN layer, generally referred to as a liner, provides good adhesion between the titanium and the oxide walls, and the TiN forms a barrier against aluminum migration.

It is possible to use sputtering to deposit an approximately conformal coating in holes of high aspect ratios, but much effort is being expended in using CVD or PECVD for one or both of these layers. It is known to deposit CVD TiN using tetrakis-dimethyl-amido titanium (TDMAT) as a precursor. This material is a metal-organic compound which is a liquid at room temperature. The TDMAT CVD process requires thermal decomposition, preferably around 450° C., and a subsequent plasma treatment to remove the carbon content in the as-deposited film. It is also known to deposit CVD Ti using titanium tetrachloride ($TiCl_4$) as the precursor. $TiCl_4$ is also a liquid at the temperatures involved and so requires a bubbler or a liquid injector to produce a gas-phase precursor, but this difference does not directly affect most aspects of the plasma processing in which the gas entraining the $TiCl_4$ is energized into a plasma adjacent to the wafer so as to activate the reaction causing titanium to deposit on the wafer.

The chemical vapor deposition of a metal layer in a plasma chamber introduces problems not experienced in PECVD chambers used for the deposition of dielectrics. Almost inevitably, some of the metal is deposited on parts of the chamber other than the wafer. The metal may be deposited on dielectric members in the chamber intended to electrically isolate various portions of the chamber. At worst, the extra metal could short out the RF-biased gas showerhead. At a minimum, the changing extent of the grounding surfaces will cause the electrical fields to vary, thus causing the uniformity of the plasma and thus the uniformity of deposition to vary over time. Accordingly, the chamber must be designed to both minimize the effect of any metal deposited on chamber parts in the processing area and also to minimize the deposition of metal in areas away from the processing.

Very recent work of others has demonstrated that the titanium deposition rate and deposition uniformity using $TiCl_4$ as the precursor can be greatly increased by maintaining the wafer at a relatively high temperatures during the plasma deposition, despite the fact that deposition is primarily plasma activated. A desired temperature range extends between 600° C. and 750° C. At these temperatures, there are several problems not experienced at the lower temperatures experienced in dielectric deposition.

Zhao et al. have addressed some of these problems, at least for TiN, in U.S. patent application, Ser. No. 08/680,724, filed Jul. 12, 1996, now issued as U.S. Pat. No. 5,846,332 and incorporated herein by reference in its entirety. This patent discloses a CVD reactor having many of but not all of the features illustrated in cross-section in FIG. 1. This figure illustrates many of the features of the TxZ CVD reactor available from Applied Materials, Inc. of Santa Clara, Calif.

A wafer 10 is supported on a surface 12 of a heater pedestal 14 illustrated in its raised, deposition position. In its lowered, loading position a lifting ring 16 attached to a lift tube 17 lifts four lift pins 18 slidably fitted into the heater pedestal 14 so that the pins 18 can receive the wafer 10 loaded into the chamber through a loadlock port 19 in the reactor body 20. The heater pedestal 14 includes an electrical resistance heater 20, which controllably heats the wafer 10 it supports. The temperatures experienced in a TiN reactor are low enough to allow the heater pedestal 14 and attached heater to be principally formed of aluminum. Often at least the upper part of the heater pedestal 14 is referred to simply as the heater.

In its upper, deposition position, the heater pedestal 14 holds the wafer 10 in close opposition to a lower surface 22 of a faceplate 24, a processing region 26 being defined between the wafer 10 and the surface 22. The faceplate 24, often referred to as a showerhead, has a large number of apertures 28 in its face 22 communicating between a lower distribution cavity 30 and the processing region 26 to allow the passage of processing gas. The processing gas is supplied through a gas port 32 formed at the center of a water-cooled gas box plate 36 made of aluminum. The upper side of the gas box plate 36 is covered by a water cooling cover plate 34 surrounding the upper portion of the gas box plate 36 that includes the gas port 32. The gas port 32 supplies the processing gas to an upper cavity 38 separated from the lower cavity 30 by a blocker plate 40, also having a large number of apertures 42 therethrough. One purpose of the cavities 30, 38, the perforated showerhead 24, and blocker plate 40 is to evenly distribute the processing gas over the upper face of the wafer 10.

A standard showerhead provided with the TiNxZ chamber has a somewhat irregular hole pattern, illustrated in the partial plan view of FIG. 2 of the showerhead face 22. A first set of holes 42 are arranged in two circles generally bracketing the periphery of the wafer 10. A second set of holes 44 are arranged in an hexagonal close packed array in side the two circles. The spacings of both sets of holes 42, 44 equal about the same small value so that the distribution of holes is fairly uniform. Law et al. in U.S. Pat. No. 4,960,488 disclose a showerhead having two densities of holes, but different gases are injected through the two sets of holes.

Returning to FIG. 1, a single circular channel or moat 46 is formed in the top of the gas box plate 36 and is sealed by the cooling water cover plate 34. Two water ports 48, 50 are formed in the center portion of the gas box plate 36 also occupied by the gas port and respectively act as inlet and outlet for cooling water supplied to cool the showerhead 24. Often a 50:50 mixture of water and glycol is used to efficiently remove heat and maintain process stability. This cooling liquid and any other cooling liquid will be henceforward referred to as cooling water. The gas box including the gas box plate 36 and the cooling water cover plate 34 rests on a fairly narrow circular ledge 52 of the showerhead 24, and a gap 54 is necessarily formed between the outer circumferential surface of the cooling water cover plate 34 and the upper, inner annular surface of the showerhead 24 because of the different temperatures that may develop in the two pieces. The cooling water cools the showerhead 24 to maintain it at a low temperature despite the plasma heating and resistive heating of the heater pedestal 14. Thereby, the processing gas tends not to coat the showerhead 24 and clog its apertures 28.

An RF power source 60 is connected to the showerhead 24 and to the gas box plate 36 and acts against the grounded chamber body 20 and the grounded heater pedestal 14 to form a plasma of the processing gas in the processing region 26. A lid isolator 64 is interposed between the showerhead 24 and a metal lid rim 66, which can be lifted off the chamber body 20 to open the chamber to provide maintenance access. The lid isolator 64 is made of an electrically insulating ceramic to isolate the RF-biased showerhead 24 from the grounded chamber body 20. A flange 65 of the showerhead 24 rests on a flange 67 of the isolator 64 through an upper, outer, bottom face 68 located above its ledge 52 supporting the gas box plate 36. Law et al., ibid., disclose an alternative arrangement of the showerhead isolator and the gas box plate.

The vacuum within the reactor is maintained by a vacuum pump 70 connected to a pump plenum 72 in the reactor body 20, which connects to an annular pumping channel 74. FIG. 3 better illustrates the pumping channel 74 defined by the lid isolator 64, a lid liner 76, an outer shield 78, an insulating chamber insert ring 82 fit in the chamber body 20, and a metal inner shield 84 fit in the chamber insert ring 82. The pumping channel 74 is connected to the processing region 26 through a straight choke aperture 86 formed between the lid isolator 24 and the metal inner shield 84. The liners 76, 78 can be easily removed during servicing to prevent build up of a metallic coating on the walls of the pumping channel 74.

An edge ring 90 is positioned within an annular ledge 92 located at the upper peripheral edge of the heater pedestal 14. The edge ring 90 is generally circular but may be modified to conform to a flat of the wafer 10. The edge ring 90 operates to center the wafer 10 through unillustrated centering bosses located at the edge of an inwardly facing annular ledge 94 of the centering ring 90. The edge ring 90 also operates to thermally isolate the ledge 92 of the heater pedestal 14 otherwise exposed by the wafer 10 on top of the heater pedestal 14. The ring 90 is supported by three ceramic pins 96 fixed to the heater pedestal 14 but sliding in short radial grooves 98 at the bottom of an outer, lower arm 100 of the edge ring 90. As better illustrated in the sectioned isometric view of FIG. 4, two thermally isolating rings 102, 104 are fixed to the bottom of an inner, upper arm 106 of the edge ring 90 by flat-headed fasteners 108. Two washers 110 placed on each fastener 108 creates a first thermally isolating gap between the upper arm 106 of the centering ring 100 and the upper isolating ring 102, a second one between the two isolating rings 102, 104, and a third one between the lower isolating ring 104 and the bottom of the ledge 92.

The structure of the thermally floating edge ring 90 and its two thermally isolating rings 102, 104 serves to thermally shield the edge ring 90 from the underlying heater pedestal 14. As a result, the periphery of the heater pedestal 14 exposed by the wafer 10 is maintained at a substantially lower temperature than the central portion to avoid undesirable film buildup during extended use. At the central portion of the heater pedestal 14, the temperature profile is flattened so that the uniformity of deposition is greatly improved.

Although the above features contribute to an improved operation of a CVD reactor, particularly one intended for deposition of a metal or other conductor such as TiN, further improvements are desired.

The heater pedestal 14 for TiN is economically formed mostly of aluminum, which however is prone to erosion from any plasma to which it is exposed, even in the area of the ledge 92 mostly occupied by the edge ring 90.

The assembly of the edge ring 90 to the heater pedestal 14 has proven to be difficult because of the multiple loose parts.

The above described chamber was designed for CVD of TiN. Substantially higher temperatures are desired for a CVD reactor depositing Ti. The higher temperature increases the difficulty of obtaining a uniform temperature profile across the heater pedestal and the wafer it supports while maintaining the temperature of the showerhead at a low temperature. The higher temperature combined with the highly corrosive $TiCl_4$ environment makes any portion of the chamber exposed to the $TiCl_4$ plasma subject to damage. These elements include the heater pedestal heater and the showerhead. Both these items are very expensive, and it is greatly desired to increase their service life by any means possible.

The higher temperatures required for the $TiCl_4$ process and its atomized state as it enters the reactor tends to produce titanium nitride deposition in the showerhead area unless temperatures there are tightly controlled at lower values. Also, the higher temperatures tend to produce thermal gradients throughout the chamber. Any such thermal gradient provides a mechanism for non-uniform deposition.

The deposition should be made as uniform as possible by any available means. If there is any non-uniformity towards the edges, the variation should be toward a somewhat thicker layer. If the variation is toward a thinner layer, there is a danger that a vanishingly small thickness is deposited in some portion of the wafer, thus severely impacting yield of operable chips. However, experience has shown that even with the improved chamber of FIGS. 1 through 4 the TiN layer tends to thin toward the edges.

SUMMARY OF THE INVENTION

The invention may be summarized as a plasma reaction chamber, particularly one intended for chemical vapor deposition of conductive materials such as titanium and titanium nitride, and particularly at higher temperatures.

The invention includes a design intended to provide thermal control of the chamber parts so as to avoid radial temperature gradients over the face of the heater pedestal supporting the wafer.

In one aspect of the invention, a perforated showerhead faceplate is positioned closely to the wafer to inject processing gas to the wafer. The faceplate is cooled by a water-cooled plate into which is formed a convolute water channel having sufficiently small cross section and sufficient number of turns to create a turbulent flow of the cooling water. The faceplate is thermally coupled to the water-cooled water plate, preferably extending a distance at least equal to that across a horizontal interface extending from an isolator around the showerhead member to a gas manifold formed in back of the faceplate. Preferably, the horizontal interface exists at the top of the showerhead and an extended flange of the gas box.

In another aspect of the invention, the distribution of holes in the showerhead is varied across the radius of the wafer to compensate for temperature gradients and other effects. Typically, this requires additional gas flow at the outer edges and hence an increased density of total aperture area closer to the periphery. The shape of the apertures may be modified to have a relatively large diameter on the processing side of the faceplate. With a carefully tailored distribution of faceplate apertures, the perforated blocker plate in back of the showerhead faceplate may be eliminated and the minimum cross section of the apertures increased, thereby reducing aerodynamic impedance.

In a further aspect of the invention applicable to highly corrosive, high-temperature processes, such as those involving $TiCl_4$, both the showerhead faceplate and the block plate are formed of solid nickel.

In yet a further aspect of the invention, a quartz plasma confinement ring rests on the heater pedestal outside the wafer and additionally protecting the heater pedestal. To minimize thermal flow, the ring rests on the heater pedestal on a downwardly extending ridge formed in the ring. A passage between the processing area and the pumping is formed between the confinement ring and a lid isolator. The confinement ring and lid isolator are shaped such that the passage is curved and downwardly providing no straight line path between the two regions. In a modification of this aspect, the confinement ring is not used, but the sloping bottom of the lid isolator induces a downward flow of the processing gas from the processing area to the pumping channel, and the extent of the slope is sufficient to shield the pumping channel from the plasma in the processing area.

An allied aspect of the invention includes positioning the heater pedestal at a height with respect to the lid isolator and possibly the confinement ring to cause processing gas to flow downwardly over the edge of the pedestal, preferably through a sloping choke aperture.

In a still further aspect of the invention, a thermally insulating edge ring is placed in a ledge recess formed at the rim of the heater pedestal generally outside of the wafer. The edge ring includes a Z-shaped thermal shield that is separated from but protects both surfaces of the ledge as well as the side of the heater pedestal. Preferably, gaps between the edge ring and one or more thermal shields are maintained by a bushing protruding from a side of the shields. Preferably also, the edge ring is electrically grounded to the heater pedestal through a strap screwed to the two members and having some mechanical flexibility, for example, being formed in a bent shape.

In yet another aspect of the invention, thermal shields are placed around the chamber wall below the heater pedestal. The shields are preferably formed of quartz or other thermally isolating ceramic and are supported on the wall by minimal mechanical contact.

BRIEF DESCRIPTION OF THE DRAWINGS

FIG. 1 is a cross-sectional view of a prior-art chemical vapor deposition plasma reactor enhanced for deposition of a conductive material such as titanium nitride.

FIG. 2 is a plan view of a showerhead electrode used with the reactor of FIG. 1.

FIG. 3 is a cross-sectional view of an area of the reactor of FIG. 1 at the periphery of the heater pedestal supporting the wafer and including the showerhead electrode and the vacuum pumping channel.

FIG. 4 is an isometric view of a thermally isolating centering ring disposed at the periphery of the heater pedestal of FIG. 1.

FIG. 5 is a plan view of a first embodiment of a showerhead of the invention.

FIG. 6 is a cross-sectional view of a showerhead hole.

FIG. 7 is a plan view of a second embodiment of a showerhead of the invention.

FIG. 8 is a cross-sectional view of a PECVD chamber of the invention particularly suited for deposition of titanium (Ti).

FIG. 9 is cut-away isometric view of the reactor of FIG. 8.

FIG. 10 is a top plan view of the cooling water channels in the reactor of FIG. 8.

FIG. 11 is a cross-sectional view of another form of showerhead holes.

FIG. 12 is a cut-away isometric view of a reactor particularly suited for deposition of titanium nitride (TiN).

FIG. 13 is a cross-sectional view of the reactor of FIG. 12.

FIG. 14 is an enlarged cross-sectional view of the portion of the reactor of FIG. 13 around the edge of the pedestal.

FIG. 15 is a cross-sectional view of the curved plasma choke region in the Ti chamber of FIG. 8.

FIG. 16 is a cross-sectional view of the plasma confinement ring of FIG. 15.

FIG. 17 is a cross-sectional view of an improved edge ring in the TiN chamber of FIGS. 12 and 13.

FIG. 18 is a cross-section view of the edge ring of FIG. 17 illustrating its support structure.

DETAILED DESCRIPTION OF THE PREFERRED EMBODIMENTS

A first way of addressing the non-uniformity problem is to provide a greater mass flow of processing gas to the peripheral edge of the wafer 10 since the edge deposition has been observed to be thinner than that in the central area. A first embodiment of a showerhead 120 achieving higher edge deposition is illustrated in plan view in FIG. 5. An outer set of outer holes 122 are arranged in circles bracketing the periphery of the wafer 10, similarly to the configuration of FIG. 2. However, the density is significantly increased. For a 200 mm wafer, each circle contains 250 to 300 holes, that is, a circumferential spacing of about 1 mm. This amounts to an offset of 1.2°. The two circles are radially separated by about 2.8 mm. Radially inward of the outer holes 122 is another set of middle holes 124 arranged in a circle about 2.3 mm inward from the inner circle of the outer holes 122. The circumferential density of these middle holes 124 is about one-half of the outer holes 122, that is, a circumferential spacing of about 2 mm. Within the circle of the middle holes 122, there is formed an hexagonally close-packed array of inner holes 126 with a spacing between nearest neighbors of about 4.4 mm. This spacing amounts to about twice that of the inner holes 124. The boundary between the triangularly arranged inner holes 126 and the circularly arranged middle holes 126 should be manually selected to place the holes fairly close together without compromising mechanical integrity. All the holes 122, 124, 126 have a fairly conventional cross section, as illustrated in FIG. 6, of a wide upper part 128 and a narrow lower part 130.

The configuration of holes 122, 124, 126 in the showerhead 120 of FIG. 5 provides a substantially higher density of holes 122 on the outer periphery and also an additional intermediate density of holes 124 between the hexagonally close-packed inner holes 126 and the circularly arranged outer holes 122. The progressive density ratios from the outside in is about 3:1 and 2:1, but the invention of this embodiment encompasses a first ratio between 2:1 and 4:1 and a second ratio between 1.5:1 and 3:1.

The showerhead 120 has been tested with TiN deposition. It has been observed to achieve an over coating near the edges. Although perfect uniformity would be more desirable, a slight over coating is more desirable than a slight undercoating. In either case, there are process variations which seemingly randomly vary the thickness up and down. If the mean deposition at the edge is an undercoat, then a given negative variation may render the TiN film to be overly thin and cause the chip to catastrophically fail. On the other hand, if the mean value is an overcoat, the same given negative variation is likely to produce a good chip, and an equal positive variation is unlikely to produce significant changes in the chip performance since the thickness of the Ti or TiN layer is mostly limited by throughput considerations rather than by performance considerations.

For TiN deposition, the showerhead 120 is most economically formed of aluminum, although it may be desirable for corrosion resistance to nickel plate the aluminum to a thickness of 7 to 10 $\mu$m. However, for the hotter Ti depositions being contemplated, it has been discovered that even the nickel coating is inadequate, but any thicker nickel coating would be prone to cracking, a source of particles. Thus, for hot Ti deposition, the showerhead should be formed of bulk nickel even though this is an expensive material and is difficult to machine. Not only does bulk nickel offer a low-corrosion material, but it better withstands the thermal cycling of a hot PECVD process. Foster has disclosed such a nickel showerhead in U.S. Pat. No. 5,665,640. Similarly, the perforated blocker plate 40 (FIG. 1) in back of the faceplate of the showerhead 24 should be formed of solid nickel for hot Ti deposition.

The embodiment of FIG. 5 for the showerhead is a specific example of a more general embodiment illustrated in plan view in FIG. 7 in which the hole density N(r) varies as a function of the radius from the center of a showerhead 140, where N(r) is a monotonically increasing function. For example, the hole density may be uniform at a value $N_0$ in a central zone 142 having a radius $r_0$ and progressively increase in outer zones 144, 146, 148. An example of the dependence is the linear function $$N(r) = N_0\left(\frac{r - r_0}{r_0}\right)$$

for the outer zone 144, 146, 148, it being assumed that the value of r is chosen as some median value within the zone. Exemplary values for N(r) are 10%, 20%, and 30% over the standard central density $N_0$. Even more variation is encompassed by the invention, but a minimum variation of 10% from the central value may be defined. The spatial and density ranges need to be determined, preferably by experimental measurement of either the film deposition profile or the gas flow patterns. Our observation is that such variation of hole density needs to implemented beginning at about 150 mm from the periphery of the wafer.

Such a tailored profile is especially useful when the CVD precursor is a liquid, for example in copper CVD or titanium CVD, which requires a bubbler or similar atomizer. With the tailored hole profile, the blocker plate 40 of FIG. 1 can be eliminated. Although the blocker plate is effective at providing a fairly uniform pressure in the lower cavity 30, it does so at the expense of a high flow impedance. That is, the atomized precursor needs to be provided at high pressure through the blocker plate. Atomized precursors are thermodynamically unstable, so a high pressure of the precursors is highly likely to cause a significant deposition in back of the blocker plate 40 and in the lines back to the bubbler. In contrast, with a carefully profiled hole distribution, an even pressure in back across the faceplate of the showerhead is not required, and the precursor can be delivered at a lower pressure, producing less deposition on the backside of the showerhead.

A profiled hole density has been successfully applied to the chemical vapor deposition of copper in a thermal process, the wafer being held at about 200° C., using the well known precursor HFAC—Cu—TMVS, also known as Cu(I). This precursor gas deposits copper at a rate approximately linearly proportional to the pressure. This process is described by Gelatos et al. in "Chemical vapor deposition of copper for advanced on-chip interconnects," *MRS Bulletin*, vol. 19, no. 8, August 1994, pp. 40–53. Alternative precursors and processes are described by Doppelt et al. in "Chemical vapor deposition of copper for IC metallization: precursor chemistry and molecular structure," ibid., pp. 41–48. Experience with a uniform showerhead pattern together with blocker plates showed more copper deposition in the supply channels than on the wafer. Profiled circular arrangements of holes were utilized for a 200 mm wafer according to the distribution listed in TABLE 1, which is based upon a constant radial gap between the circles.

TABLE 1

| Circle Number | Number of Holes | Circle Radius (inch) | Hole Density $(cm^{-2})$ |
|---|---|---|---|
| 1 | 1 | 0.00 | 6.09 |
| 2 | 6 | 0.18 | 4.57 |
| 3 | 13 | 0.36 | 4.95 |
| 4 | 19 | 0.54 | 4.82 |
| 5 | 25 | 0.72 | 4.76 |

TABLE 1-continued

| Circle Number | Number of Holes | Circle Radius (inch) | Hole Density (cm$^{-2}$) |
|---|---|---|---|
| 6 | 31 | 0.90 | 4.72 |
| 7 | 38 | 1.08 | 4.82 |
| 8 | 44 | 1.26 | 4.79 |
| 9 | 50 | 1.44 | 4.76 |
| 10 | 57 | 1.62 | 4.82 |
| 11 | 63 | 1.80 | 4.80 |
| 12 | 70 | 1.98 | 4.85 |
| 13 | 77 | 2.16 | 4.89 |
| 14 | 84 | 2.34 | 4.92 |
| 15 | 92 | 2.52 | 5.00 |
| 16 | 100 | 2.70 | 5.08 |
| 17 | 108 | 2.88 | 5.14 |
| 18 | 117 | 3.06 | 5.24 |
| 19 | 127 | 3.24 | 5.37 |
| 20 | 137 | 3.42 | 5.49 |
| 21 | 148 | 3.60 | 5.63 |
| 22 | 161 | 3.78 | 5.84 |
| 23 | 173 | 3.92 | 5.99 |
| 24 | 182 | 4.06 | 6.03 |

The hole densities shown in the table are based upon bands centered on the hole circles. Much of the variations, especially for the inner circles, are caused by quantization error arising from use of just a few holes in the circle. Other distributions are available which eliminate these quantization errors.

The profiled hole distribution allow the holes to be formed in a straight cylindrical shape with a diameter of 1.6 mm versus the usual diameter of 0.4 mm, and it further allows the elimination of the blocking plate. These two features reduce the aerodynamic impedance so that the copper precursor gas can be supplied at a much lower pressure. Nonetheless, the copper thickness uniformity was improved over the standard showerhead from 5% to 3%.

The modifications of the showerhead are effective at compensating for thermal distributions that degrade the uniformity of deposition. However, a more direct approach is to improve the cooling of the faceplate of the showerhead so as to keep it at a constant temperature, thus ensuring wafer-to-wafer reproducibility. One approach to better thermal control of the showerhead is illustrated for a Ti deposition chamber 150 illustrated in cross section in FIG. 8 and in cut-away isometric view in FIG. 9, for which parts similar to those of FIG. 1 are commonly numbered. Its heater pedestal 152 is shallower and is connected to a pedestal stem 154, itself connected to vertical moving means. The heater portion of the heater pedestal 152 is formed of a ceramic because of the high temperatures required. The ceramic composition alleviates some of the thermal transfer problems so that the thermally isolated edge ring is not required for the titanium chamber.

A metallic showerhead 156 has a relatively short upwardly extending rim 158 screwed to a metallic gas box plate 160. A convolute water channel 162, illustrated in plan view in FIG. 10, is formed in the top of the gas box plate 160 and covered and sealed by the cooling water cover plate 34. The water ports 48, 50 through the cooling water cover plate 34 are not illustrated in FIG. 8, but they connect ends 164, 166 of the water channel 162 near to the center of the gas box plate 160. The convolute water channel 162 is formed in a serpentine though generally circumferential path having three sharp U-turns 168 or U-shaped bends as it progresses from the inside to the outside until it returns to the inside in a radial channel 170.

The water channel 162 is narrow enough and its bends 168 are sharp enough to ensure that the flow of water become turbulent, thus aiding the flow of heat from the flange of the gas box plate 160 to the water in the channel 162. In contrast, the single moat-shaped water channel 46 in FIG. 1 is relatively wide with no sharp bends with the result that the water may well flow laminarly over much of the moat 46. In laminar flow, the portion of water next to the channel edges flows much more slowly than in the center. As a result, heat is not efficiently transferred to the fastest flowing central portion of the cooling water.

Returning to FIGS. 8 and 9, the upwardly extending rim 158 of the showerhead 156 is screwed to a bottom rim 172 of the gas box plate 160. Both these rims 158, 172 are maximally sized between an encompassing lid isolator 174 and the encompassed lower cavity 30 of the showerhead 156. The screw fastening between the two members 156, 160 ensure good thermal contact over the maximally sized contact area. The thermal flow area extends from the outside at the lid isolator 174 (except for a gap between the isolator 174 and either the showerhead 156 or the gas box plate 160) to the inside at the lower cavity 30. There is no vertically extending gap 54 (see FIG. 1) between the flange of the water-cooled gas box plate 160 and the showerhead 156 that would impede conductive cooling of the showerhead 156. Note that the outer flange of the gas box plate 160 rests on the lid isolator 174 in contrast to the prior art structure of FIG. 1 in which the showerhead 24 rests on the lid isolator 64.

The structure of the water cooling channels 162 ensures efficient thermal transfer between the water and the gas box plate 160, and the mechanical interface between the flange of the gas box plate 160 and the showerhead 172 ensures efficient thermal transfer between them. Accordingly, the cooling of the showerhead 172 is greatly enhanced.

The shape of holes 180 in the showerhead 156 can be improved to decrease thermal transfer between the showerhead 156 and the plasma. As illustrated in cross section in FIG. 11, each hole 180 includes a wider cylindrical portion 182 at the side facing the plasma in the processing area 26, and it is connected to a narrower cylindrical portion 184 facing the bottom cavity 30. This configuration is the opposite of the standard configuration of FIG. 6 and exposes a minimum amount of the showerhead material directly to the plasma while the more massive back of the showerhead provides mechanical strength.

Gas is supplied to the gas port 32 and water is supplied to and from the water ports 48, 50 through a voltage gradient assembly 190 (also referred to as an output manifold), illustrated in FIGS. 9 and 12, having a proximate end supported on the chamber body 20 and a distal end of over the center of the chamber. The voltage gradient assembly 190 also couples RF power to the showerhead 156, 200. In order to electrically isolate the showerhead 156, 200 from the gas panel, external gas lines, and the water chiller, the voltage gradient assembly 190 includes graphite or quartz tubes through which the gas and water are supplied and which provide a highly resistive path from the showerhead 156, 200 to ground.

The invention has been implemented for a TiN chamber, as shown in the partially sectioned isometric view of FIG. 12 and the cross-sectional side view of FIG. 13. The TiN chamber includes the convolute cooling water channel 162 formed in the gas box plate 36. In the TiN chamber, a showerhead 200 includes a long upwardly extending rim 202 and a wide outwardly extending flange 204 attached to the top of the rim 202. A gas box plate 206 including the convolute cooling water channel 162 has a wide outwardly extending flange 208 resting on the showerhead flange 204, thereby providing good thermal contact though over a longer path. The showerhead flange 204 rests on the ceramic or quartz lid isolator 174. An advantage of the design of FIG. 12 compared to that of FIG. 9 is that better cooling is accomplished through the gas box plate 206. The material continuity of the showerhead 200 of FIG. 12 assures efficient delivery of RF power to the processing region 26.

It is important, for both the plasma titanium deposition process and the titanium nitride plasma treatment, to confine the plasma to the processing region 26 at the edge of the heater pedestal in order to minimize the unwanted deposition of the titanium within the pumping channel 74. The confinement can be achieved in at least two ways, as practiced alternatively by the TiN and Ti chambers.

The lid isolator 174 for the TiN chamber, as best detailed in FIG. 14, includes a generally planar bottom surface 174a extending inwardly generally at a level of the bottom of the showerhead 200. It also includes an outer lip 174b, a concave top side of which defines a side portion of the pumping channel 74. The outer lip 174b has an inner lower surface 174c that slopes downwardly from the level of the showerhead 200 and which includes a concave portion, a linearly sloping portion, and a horizontal portion 174d that terminates next to the pumping channel 74. The inner shield 84 resting on the insert ring 82 includes an upwardly extending ridge 84a, which defines together with the innermost area of the isolator horizontal lower surface portion 174d a choke point for the flow of gas from the processing area 26 to the pumping channel 74. The inner shield 84 is preferably formed of a metal such as aluminum while the insert ring 82 is preferably formed of a ceramic such as alumina or aluminum nitride.

The figures show the heater pedestal 14 to be somewhat lower than its operational position. During generation of the plasma, the top of the wafer 10 supported on the heater pedestal 14 is generally at the same height as the isolator horizontal lower surface portion 174d with the wafer 10 separated from the showerhead 200 by about ¼" (6 mm). Two effects are thereby achieved. As illustrated, sloping portion of the isolator lower surface 174c forces the gas to flow downwardly from the processing region 26 to below the top of the heater pedestal 14. This is believed to prevent the plasma from propagating into the pumping channel 74. Also, there is no direct line of sight from the plasma in the processing region 26 into the pumping channel, thus preventing ions extracted from the plasma from directly hitting the surfaces within the pumping channel.

The plasma confinement is achieved somewhat differently in the Ti chamber than in the TiN chamber, as illustrated in the cross-sectional view of FIG. 15, which is an enlarged view of the area the heater pedestal edge also shown in FIG. 8. During plasma generation for the $TiCl_4$ process, RF power is applied to the heater pedestal 152 as well as to the showerhead 156. A confinement ring 210, which is individually illustrated in the yet larger cross-sectional view of FIG. 16, is supported on its innermost end by a narrow annular wall or ridge 211 resting on the upper periphery of the heater pedestal 152 outside of the area of wafer. The narrow ridge 211 minimizes thermal contact. The confinement ring 210 includes a curved upper surface 212 that is generally horizontal over the heater pedestal 152 but gradually slopes downwardly outside of the heater pedestal 152. The isolator 174 has a lower annular knob 214 with a generally planar ledge 216 extending inwardly to support the showerhead 156 and in its processing position is spaced from the horizontal portion of the ring's upper surface 212 by a nearly constant gap 218 of about 0.165" (4.2 mm).

Both the confinement ring 210 and the lid isolator 174 have inner facing surfaces located just outside of the exposed portion of the showerhead 156 and are formed of quartz so that they are electrically insulating and confine the plasma to the processing area 26 because of adsorbed charge. However, the inner end of the confinement ring 210 may be extended very close to the wafer 10 to protect the otherwise exposed periphery of the heater pedestal 152. The small gap 218 between the lid isolator 174 and the confinement ring 210 prevents plasma from spreading out to the pumping channel 74, and it also serves as an aerodynamic choke aperture to achieve even radial pumping from the processing region 30 to the pumping channel 74. As described above, the TiN chamber of FIGS. 12 and 13 includes a similar lid isolator 174 but does not include the confinement ring 210.

An outwardly extending portion 220 of the isolator knob 214 includes a curved lower surface 220 generally following the curved ring surface 212 so as to maintain the size of the gap 218. However, the gap 218 curves downwardly to such an extent that there is no straight line view between the processing area 26 and the pumping channel 74. We have demonstrated that the curved gap 218 prevents the plasma within the processing area from propagating into the annular pumping channel, we believe, because the curved gap 218 increases the diffusion length. The confinement of the plasma away from the pumping channel 74 is especially important for Ti CVD because titanium is difficult to plasma clean. Further, plasma confinement prevents Ti deposition on the backside of the heater pedestal 152 and one the lower chamber parts in the presence of the very hot temperatures used in Ti CVD. The confinement ring 210 further acts to protect the periphery of the heater pedestal 152 from the plasma.

The area around the edge ring 90 in the TiN chamber of FIG. 13 has been improved as illustrated in the cross-sectional view of FIG. 17. The upper isolator ring 102 of FIG. 4 has been retained but the lower isolator ring 104 has been replaced by a Z-shaped annular thermal shield 230 including an inner, upwardly extending cylindrical portion 232, an outer, downwardly extending portion 234, and a connecting ring portion 236. Except for a three-point support structure, the thermal shield 230 is separated from the pedestal 14 by a gap, thereby providing thermal isolation. Further, the inner cylindrical portion 232 of the thermal shield 230 protects an inner wall 238 of the ledge 92 formed in the heater pedestal 14 just underneath the periphery of the wafer 10; the ring portion 236 protects the ledge 92 accommodating the edge ring 90; and, the outer cylindrical portion 234 protects the entire outer sidewall 240 of the heater pedestal 14. Thereby, the aluminum heater pedestal 14 is almost completely shielded by either the wafer 10 or the thermal shield 230.

The edge ring 90 is preferably made of aluminum, and the upper isolator ring 102, and the thermal shield 230 are preferably composed of stainless steel, a corrosion-resistant metal with low thermal conductivity.

For the great majority of their circumferences, the edge ring 90, the upper isolator 102, and the thermal shield 230 are separated from each other and from the heater pedestal 14 by gaps and are thus thermally isolated, decreasing thermal flow from the exposed periphery of the heater pedestal 14 to the showerhead 200.

An improved three-point support structure for the edge ring 90 is shown in the cross-sectional view of FIG. 18. A bushing 250 is force fit into an axial hole bored in the isolator ring 102 and has a length greater than the thickness of the isolator ring 102. The force fitting is performed such that ends of the bushing 250 extend above and below the isolator ring 102 to act as spacers between the isolator ring 102 and both the edge ring 90 and the ring portion 236 of the thermal shield 230. Thereby, there is no need for separate washers, as is done in the design of FIG. 4. Three flat-head screws 252 are fit into counter-sunk pass holes in the ring portion 236 of the thermal shield 230, freely pass through a central bore of the bushing 250, and are screwed into tapped bottomed holes 254 extending from the bottom of the upper arm 106 of the edge ring 90.

A flat surface at the bottom of the edge ring 90 rests freely on three slotted support screws 258 threaded into screw holes 258 tapped axially at the periphery of the heater pedestal 14 in the area of local recesses 260. The three-point support provides minimal thermal conductance between the heater pedestal 14 and the edge ring 90, and the three screws 258 can be rotatably adjusted to flatten the orientation of the edge ring 90. The bottom surfaces of the edge ring 90 resting on the support screws are flat, thereby allowing some radial movement of the edge ring to accommodate differential thermal expansion.

To prevent charging of the aluminum edge ring 90, it is solidly electrically connected to the heater pedestal 14 through one or more electrical straps 262 associated with the three support screws 260. The strap 262 includes an inwardly extending tab 264 with a hole through which passes the support screw 256 and which is captured between a boss 266 on the support screw 260 and the heater pedestal 14. The strap 262 also includes an upwardly extending arm 268 passing through a circumferential slot 270 in the ring portion 236 of the thermal shield. A long second tab 272 connected to the upper end of the strap arm 268 extends circumferentially of the edge ring 90 with a corresponding circumferential recess 274 formed at the bottom of the outer edge of the edge ring 90 with a thin wall 276 formed between the recess 274 and the outer periphery of the edge ring. An unillustrated hole is tapped into near the end the long second tab 272. A set screw 278, illustrated in FIG. 13, is screwed through a tapped through hole in the wall 272 of the edge ring 90 and selectively engages the hole tapped through the tab 272 of the strap 262, thereby providing electrical connection between the edge ring 90 and the heater pedestal 14.

The design of the strap, particularly its bent shape and two screw connections, has the advantage of providing limited mechanical flexibility during the thermal cycling of the parts.

The assembly of the edge ring is straightforward and can be accomplished without removing the heater pedestal 14 from the chamber. The support screw 256 is passed through the hole in the inner tab 266 of the strap 262 and is screwed into the tapped pedestal hole 258 so as to capture the strap 262. In a separate operation, the edge ring 90, isolator ring 102, and thermal shield 234 are fixed to each other by the screws 252. The set screws 278 can at all times be left in the wall 276 of the edge ring 90 to eliminate any extra parts. The edge ring assembly 90, 102, 230 is then lowered onto support screws 256 extending from the top of the heater pedestal 14 with the upper arms 268 of the straps 262 passing through the holes 270 in the thermal shield 230. The set screws 278 are then fastened to the strap tab 272, providing the only fixed, though somewhat flexible, connection between the edge ring 90 and the heater pedestal 14. All the parts associated with the edge ring 90 are preferably made of stainless steel except for that the bent sheet strap 262 and the edge ring 90 itself are of aluminum.

As illustrated best in FIG. 14, the tubular chamber insert 84 supporting the aluminum inner shield is supported in the TiN chamber body 20 surrounding the edge of heater pedestal 14 just outside of the outer cylindrical portion 234 of the thermal shield 230 with a gaps formed between the heater pedestal 14 and the cylindrical portion 234 of the thermal shield and between the chamber insert 84 and the chamber wall 20. Thereby, the lateral thermal impedance is also increased. Accordingly, the heater pedestal 14 and the supported wafer 10 can be heated to a high temperature with low thermal flow from the heater pedestal 14 to either the showerhead 200 or the chamber 20. Although there is large thermal flow between the wafer 10 and the showerhead 200, it is uniform over the surface of the wafer 10.

The temperatures associated with the Ti-CVD chamber are substantially above those previously experienced in CVD chambers. Accordingly, extra precautions need to be exercised to prevent deleterious thermal gradients, even on the backside of the heater pedestal. As illustrated in FIG. 8, an annular chamber liner 280 made of quartz not only defines a side of the pumping channel 74 but also partially defines a further choke aperture 282 (see FIG. 15 also) between the processing area 26 and the pumping channel 74. It also supports the confinement ring 210 in the lowered position of the heater pedestal 152, 154. Further, as better illustrated in FIG. 8, the chamber liner 280 also surrounds a circumference at the back of the heater pedestal 152. The chamber liner 280 rests on a narrow ledge 283 in the chamber body 20, but there is little other contact, so as to minimize thermal transport.

Below the chamber liner 280 is located a Z-shaped lower chamber shield 284, preferably made of opaque quartz. The lower chamber shield 284 rests on the bottom of the chamber 20 on an annular boss 286 formed on the bottom of the bottom inwardly extending arm of the isolator 284. The quartz prevents radiative coupling between the bottom of the heater pedestal 152 and the Ti chamber 20, and the narrow boss 286 minimizes conductive heat transfer to the chamber 20. Tests have shown that with the lower chamber thermal shield 284, better uniformity of deposition onto the wafer 10 is achieved. An alternative design for the lower chamber shield 284 includes an inwardly extending bottom lip joined to a conically shaped upper portion conforming to the inner wall of the chamber 20. While this design is operationally satisfactory, the sloping shape is much more expensive to fabricate in quartz.

Preferably, the lift ring 16 is also made of quartz so as to minimize heat transfer from the heater pedestal 152 through the lift pins 18 (FIG. 1) and the lift tube 17 to the lift mechanism.

Although the two reactors described in detail have been designed for the deposition of Ti and TiN, the many aspects of the invention may be applied to other plasma reactors, especially CVD chambers for the high-temperature deposition of metals or of other materials, such as the perovskite oxides, polysilicon, metal silicides, refractory nitrides, etc.

These features alone or in combination provide for a more uniform temperature distribution and hence a more uniform coating thickness. Several of the features also facilitate maintenance and reduce wear on larger parts. Nonetheless, the required changes from the prior art are relatively small.

What is claimed is:

1. An apparatus for chemical vapor deposition, comprising:
   a reaction chamber;
   a generally circular pedestal included in said chamber for supporting a substrate on a top surface thereof;

a showerhead assembly including a faceplate disposed in parallel and above said top surface of said pedestal, including holes therethrough for supplying processing gas to a plasma processing region between said faceplate and said pedestal, and being adapted to receive RF power to excite said processing gas in said plasma processing region into a plasma;

an electrical isolator disposed between said showerhead assembly and a portion of said reaction chamber on a lateral side of said pedestal;

a generally annularly shaped pumping channel surrounding a lateral side of said processing area; and an insulating ring disposable on an upper periphery of said pedestal below said isolator and defining with said isolator a sloping gap which forms a channel between said plasma processing area and said pumping channel, said insulating ring further acting to confine said plasma to said plasma processing area.

2. The apparatus of claim 1, wherein said sloping gap provides no straight line path between said processing area and said pumping channel.

3. The apparatus of claim 1, wherein said ring disposed on said pedestal extends down a lateral side of said pedestal.

4. The apparatus of claim 1, wherein said ring includes a downwardly projecting ridge supporting said ring on said pedestal.

5. The apparatus of claim 1, wherein said ring extends radially inwardly to an edge of said substrate.

6. The apparatus of claim 1, wherein said insulating ring is supportable on an upper periphery of said pedestal below said isolator by a downwardly projecting ridge portion of said ring.

7. The apparatus of claim 1, wherein said pedestal includes a heater and further comprising a removable, annularly shaped, thermally insulating member disposed within a lower portion of said reaction chamber below said pedestal and shielding walls of said lower portion of said reaction chamber from said pedestal.

8. The apparatus of claim 1, wherein said showerhead assembly further includes a cooling plate thermally coupled to said faceplate and including a convolute cooling fluid channel formed therein to cause turbulent flow of a cooling fluid in said channel.

9. The apparatus of claim 1, wherein a flange of said faceplate is supported on said isolator and wherein said showerhead assembly further includes a cooling plate including a cooling fluid channel formed therein and having a cooling plate flange supported on said flange of said faceplate.

10. An apparatus for chemical vapor deposition, comprising:

a reaction chamber;

a generally circular pedestal included in said chamber for supporting a substrate on a top surface thereof;

a showerhead assembly including a faceplate disposed in parallel to and above said top surface of said pedestal, including holes therethrough for supplying processing gas to a processing region between said faceplate and said pedestal, and being adapted to receive RF power to excite said processing gas in said processing region into a plasma;

an electrical isolator disposed between said showerhead assembly and a portion of said reaction chamber on a lateral side of said pedestal; and an electrically insulating confinement ring supportable on an upper periphery of said pedestal below said isolator by a downwardly projecting ridge portion of said ring and acting to confine said plasma to within said processing region.

11. The apparatus of claim 10, further comprising a generally annular pumping channel surrounding a lateral side of said processing area and wherein a sloping gap is formed between said isolator and said confinement ring that affords no straight line path between said processing region and said pumping channel.

12. The apparatus of claim 10, wherein said confinement ring comprises quartz.

13. The apparatus of claim 10, wherein said confinement ring extends down a side of said pedestal.

14. An apparatus for chemical vapor deposition, comprising:

a reaction chamber;

a pedestal included in said chamber for supporting a substrate on a top surface thereof; and a showerhead assembly disposed in opposition to said pedestal and including a faceplate disposed in parallel to and above said top surface of said pedestal and including holes therethrough for supplying a processing gas to a processing region between said faceplate and said pedestal from a first cavity in back of said faceplate, a blocker plate disposed in parallel to and above said faceplate and including holes therethrough for supplying said processing gas from a second cavity in back of said faceplate to said first cavity, and a gas port disposed above said first cavity for supplying said processing gas to said second cavity;

wherein both of said faceplate and said blocker plate are formed of a solid nickel material.

15. The apparatus of claim 14, wherein said faceplate is adapted to receive RF energy to excite said processing gas into a plasma adjacent to said pedestal and further comprising:

an electrical isolator disposed between said showerhead assembly and a portion of said reaction chamber on a lateral side of said pedestal;

a generally annularly shaped pumping channel surrounding a lateral side of said processing region; and an insulating ring disposable on an upper periphery of said pedestal below said isolator and defining with said isolator a sloping gap which forms a channel between said processing region and said pumping channel, wherein said sloping gap affords no straight line path between said processing area and said pumping channel.

16. An apparatus for chemical vapor deposition, comprising:

a reaction chamber;

a generally circular pedestal included in said chamber for supporting a substrate on a top surface thereof, said pedestal having a disk-shaped upper portion including a resistive heater and a stem supporting said upper portion and extending downwardly in a lower portion of said reaction chamber, said pedestal including a heater;

a showerhead assembly including a faceplate disposed in parallel to and above said top surface of said pedestal, including holes therethrough for supplying processing gas to a processing region between said faceplate and said disk-shaped upper portion of said pedestal; and a removable, annularly shaped, thermally insulating member disposed within said lower portion of said reaction chamber and shielding walls of said lower portion of said reaction chamber from a downwardly facing surface of said disk-shaped upper portion of said pedestal.

17. The apparatus of claim 16, wherein said thermally insulating member comprises quartz.

18. The apparatus of claim 16, wherein said insulating member is Z-shaped and rests on a bottom wall of said reaction chamber.

19. The apparatus of claim 18, wherein said insulating member includes an annular boss on its lower surface to support said insulating member on said bottom wall of said reaction chamber.

20. A method for forming a CVD layer on a substrate, comprising the steps of:

providing a processing chamber including
a chamber body,
a pedestal movably disposed on the chamber body and having a periphery removably supporting a confinement ring member having an upper surface, and
a chamber lid assembly supported by the chamber body and having an isolator ring member with a lower essentially arcuate surface terminating in a lower isolator ring edge;

disposing a substrate on said pedestal;

elevating said pedestal including said substrate until at least a portion of said upper surface of said confinement ring member extends vertically to at least said lower isolator ring edge of said isolator ring member; and processing said substrate including heating said pedestal to a temperature greater than 600° C. and contacting said substrate with a processing gas to form a CVD layer on said substrate.

21. A method for forming a CVD layer on a substrate, comprising the steps of:

providing a processing chamber including
a chamber body,
a pedestal movably disposed on the chamber body and having a periphery removably supporting a confinement ring member having an upper surface, and
a chamber lid assembly supported by the chamber body and having an isolator ring member with a lower essentially arcuate surface terminating in a lower isolator ring edge;

disposing a substrate on said pedestal;

elevating said pedestal including said substrate until at least a portion of said upper surface of said confinement ring member extends vertically to at least said lower isolator ring edge of said isolator ring member; and processing said substrate including contacting said substrate with a processing gas to form a CVD layer on said substrate, wherein said CVD layer consists essentially of titanium.

22. A method for forming a CVD layer on a substrate, comprising the steps of:

providing a processing chamber including
a chamber body,
a pedestal movably disposed on the chamber body and having a periphery removably supporting a confinement ring member having an upper surface, and
a chamber lid assembly supported by the chamber body and having an isolator ring member with a lower essentially arcuate surface terminating in a lower isolator ring edge;

disposing a substrate on said pedestal;

elevating said pedestal including said substrate until at least a portion of said upper surface of said confinement ring member extends vertically to at least said lower isolator ring edge of said isolator ring member; and processing said substrate including contacting said substrate with a processing gas comprising $TiCl_4$ to form a CVD layer comprising titanium on said substrate.

23. The method of claim 22, wherein said processing step includes heating said pedestal to a temperature greater than 600° C.

* * * * *